United States Patent
Kanakasabapathy et al.

(10) Patent No.: US 8,541,275 B2
(45) Date of Patent: Sep. 24, 2013

(54) SINGLE METAL GATE CMOS INTEGRATION BY INTERMIXING POLARITY SPECIFIC CAPPING LAYERS

(75) Inventors: Sivananda Kanakasabapathy, Albany, NY (US); Hemanth Jagannathan, Albany, NY (US); Matthew Copel, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 872 days.

(21) Appl. No.: 12/616,941

(22) Filed: Nov. 12, 2009

(65) Prior Publication Data
US 2011/0108921 A1    May 12, 2011

(51) Int. Cl.
*H01L 21/8238* (2006.01)

(52) U.S. Cl.
USPC ..... 438/216; 438/591; 438/528; 257/E21.639

(58) Field of Classification Search
USPC ......... 257/405, 406, 407, E21.639; 438/216, 438/528, 591
See application file for complete search history.

(56) References Cited

U.S. PATENT DOCUMENTS

| | | | |
|---|---|---|---|
| 6,602,753 B2 | 8/2003 | Koyama et al. | |
| 7,576,399 B2 * | 8/2009 | Li | 257/412 |
| 2005/0269651 A1 | 12/2005 | Chen et al. | |
| 2008/0085610 A1 | 4/2008 | Wang et al. | |
| 2009/0218634 A1 * | 9/2009 | Sakashita et al. | 257/369 |
| 2010/0052063 A1 * | 3/2010 | Masuoka et al. | 257/369 |
| 2011/0089495 A1 * | 4/2011 | Gluschenkov et al. | 257/369 |

* cited by examiner

*Primary Examiner* — Calvin Lee
*Assistant Examiner* — Scott Stowe
(74) *Attorney, Agent, or Firm* — Tutunjian & Bitetto, P.C.; Louis J. Percello

(57) ABSTRACT

A method for forming a complementary metal oxide semiconductor device includes forming a first capping layer on a dielectric layer, blocking portions in the capping layer in regions where the capping layer is to be preserved using a block mask. Exposed portions of the first capping layer are intermixed with the dielectric layer to form a first intermixed layer. The block mask is removed. The first capping layer and the first intermixed layer are etched such that the first capping layer is removed to re-expose the dielectric layer in regions without removing the first intermixed layer.

14 Claims, 6 Drawing Sheets

US 8,541,275 B2

SINGLE METAL GATE CMOS INTEGRATION BY INTERMIXING POLARITY SPECIFIC CAPPING LAYERS

BACKGROUND

1. Technical Field

The present invention relates to semiconductor fabrication, and more particularly to a device and method for forming a single metal, single dielectric gate CMOS device having capping layers that are intermixed with a high dielectric constant dielectric designed to shift threshold voltage

2. Description of the Related Art

High dielectric constant (high-K) materials are one of the most important advancements pursued in Silicon Technology to enable continued scaling of metal oxide semiconductor field effect transistors (MOSFETs) among other semiconductor devices. To obtain band-edge operation of these devices a correct choice of dielectric and metal has a significant impact on device performance. However, single metal/single dielectric solutions have simplicity in integration, but not for tuning threshold voltages of complementary metal oxide semiconductor (CMOS) devices.

Capping layers have been recently investigated to obtain band edge n-type field effect transistor (nFET) and p-type field effect transistor (pFET) devices. However, there are many challenges in integrating both materials on a same wafer to obtain CMOS devices. Current schemes involve the deposition and patterning of these capping layers which can introduce additional complexity for lithographic processes and are often material specific solutions.

SUMMARY

A method for forming a complementary metal oxide semiconductor device includes forming a first capping layer on a dielectric layer, blocking portions in the capping layer in regions where the capping layer is to be preserved using a block mask. Exposed portions of the first capping layer are bombarded to drive elements of the first capping layer into the dielectric layer to form a first intermixed layer. The block mask is removed. The first capping layer and the first intermixed layer are etched such that the first capping layer is removed to re-expose the dielectric layer in regions without removing the first intermixed layer.

Another method for forming a complementary metal oxide semiconductor device includes forming a first capping layer on a dielectric layer; blocking portions of the capping layer in regions where the capping layer is to be preserved using a block mask; bombarding exposed portions of the first capping layer to drive elements of the first capping layer into the dielectric layer to from a first intermixed layer; removing the block mask; etching the first capping layer and the first intermixed layer such that the first capping layer is removed to re-expose the dielectric layer in regions without removing the first intermixed layer; forming a second capping layer on the re-exposed dielectric layer and the first intermixed layer; blocking portions in the second capping layer in regions where the second capping layer is to be preserved using a second block mask; bombarding exposed portions of the second capping layer to drive elements of the second capping layer into the dielectric layer to from a second intermixed layer; removing the second block mask; etching the second capping layer and the second intermixed layer such that the second capping layer is removed to re-expose the first intermixed layer in regions without removing the second intermixed layer; and forming transistors using the first intermixed layer for a first transistor type and using the second intermixed layer for a second transistor type.

A complementary metal oxide semiconductor (CMOS) device includes an nFET device having a first gate stack including a first intermixed layer, the first intermixed layer including a mixture of a high dielectric constant layer and a separately deposited first capping layer. A pFET device has a second gate stack formed simultaneously with the first gate stack and including a second intermixed layer, the second intermixed layer including a mixture of a high dielectric constant layer and a separately deposited second capping layer such that the nFET and the pFET form a single metal, single dielectric CMOS device.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
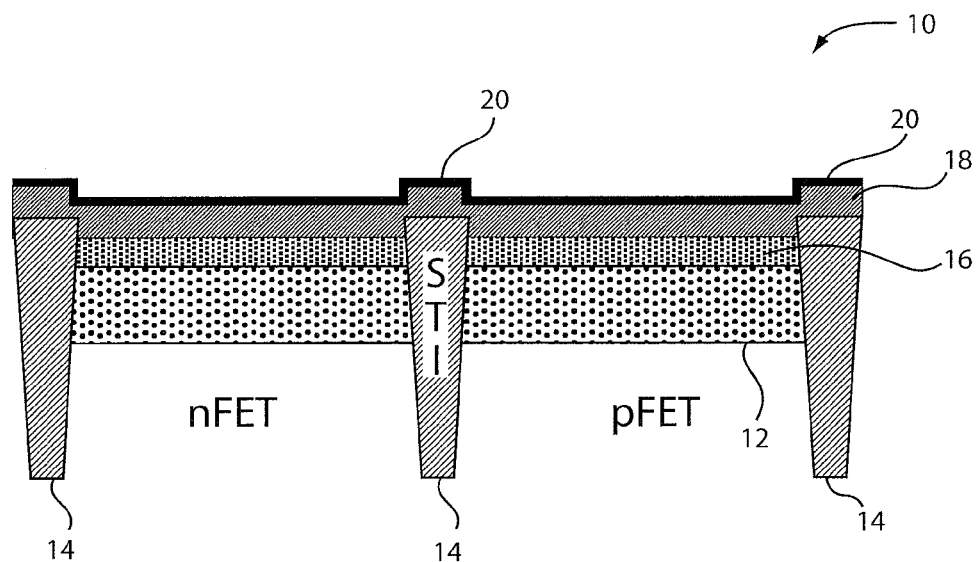
FIG. 1 is a cross-sectional view of a partially fabricated metal gate high dielectric constant transistor device having a first capping layer formed on the high dielectric constant layer.

In accordance with the present principles, a device and method are provided that selectively intermix capping materials on a wafer by using a patterned resist. The resist and un-mixed capping material are subsequently removed to obtain a patterned capping layer on the wafer. This technique is can be used in sequence for capping materials for both n-type field effect transistors (nFETs) and p-type field effect transistors (pFETs). A solution for complementary metal oxide semiconductor (CMOS) capping layer integration intermixes the capping layer in specific regions of a wafer using a mask. The intermixing procedure enables the use of chemicals that can remove un-mixed material from the remaining regions of the wafer enabling a simple single metal, single dielectric process with band edge CMOS devices on the same wafer.

It is to be understood that the present invention will be described in terms of a given illustrative architecture having a silicon wafer; however, other architectures, structures, substrate materials and process features and steps may be varied within the scope of the present invention. In one illustrative embodiment, CMOS devices are fabricated The circuit as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a partially fabricated semiconductor device 10 includes a semiconductor substrate 12 having shallow trench isolation (STI) regions 14 formed therein. The STI regions 14 provide electrical isolation between components, e.g., field effect transistors, formed on the device 10. The STI regions 14 may include dielectric materials such as silicon oxide or other dielectrics. An interface layer 16 is formed on the substrate 12 and may include a gate oxide or other dielectric layer between a high dielectric constant layer 18 and the substrate 12. The high dielectric constant layer 18 may include, e.g., rare earth oxides and/or their silicates, such as, hafnia, zirconia, gadolinium and lanthanum oxides and their silicates with varying amounts of silicon content.

A capping layer 20 is formed over the high dielectric constant layer 18. The capping layer 20 may include, for example, lanthanum oxide (e.g., employed for nFET devices) or aluminum oxide (e.g., employed for pFET devices).

The capping layer 20 for nFETs may comprise at least one element from Group 2 (e.g., IIA) or 3 (e.g., IIIA) of the Periodic Table of Elements. Examples of Group 2 elements that can be used include Be, Mg, Ca, Sr and/or Ba. Examples of Group 3 elements include, for example, Sc, Y, La, Ce, Pr, Nd, Pm, Sm, Eu, Ga, Tb, Dy, Ho, Er, Tm, Yb, Lu or mixtures thereof. Preferably, the capping layer 20 is a rare earth metal-containing layer that comprises an oxide of La, Ce, Y, Sm, Er, and/or Tb, with La2O3 or LaN being most preferred. The capping layer 20 for pFETs may comprise at least one element from Group 13, and includes B, Al, Ge, and/or In or their oxides. The capping layer 20 is preferably only a few nanometers thick, but may be varied depending on the application.

Figure 2:
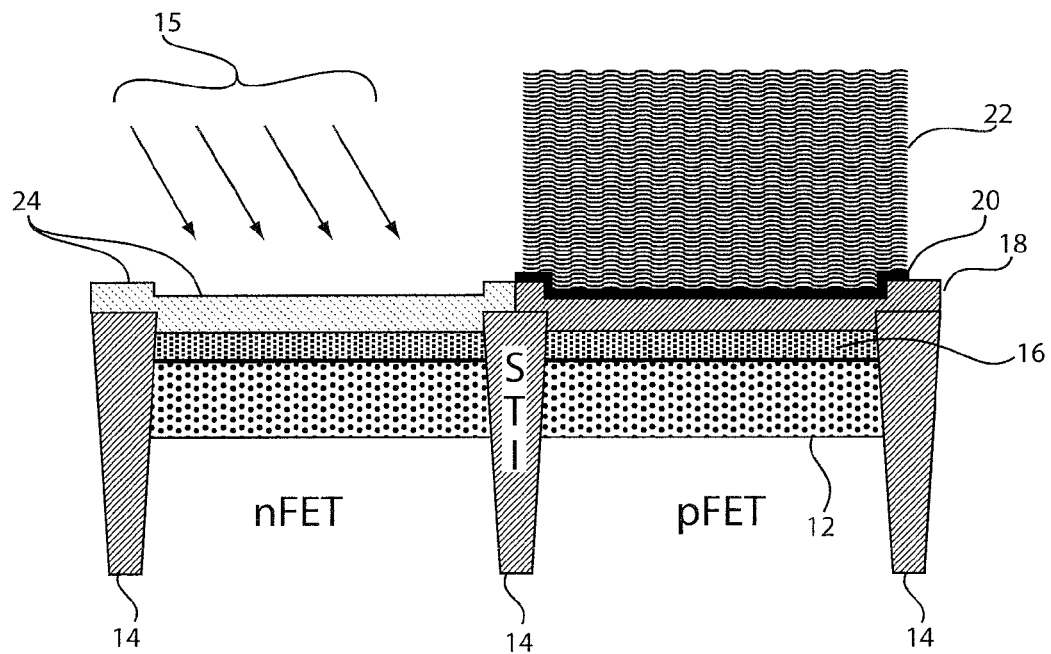
FIG. 2 is a cross-sectional view of the device of FIG. 1 having a block mask formed on portions of the first capping layer and other portions of the first capping layer being bombarded to form a first intermixed layer.

Referring to FIG. 2, a block mask 22 is deposited over the capping layer 20 and lithographically patterned to remain at locations where the capping layer 20 is to be removed. The block mask 22 preferably includes a mask that holds up well against noble gas ion bombardment. For example, block mask 22 should maintain its adhesion to capping layer 20 during subsequent processing. Block mask 22 may include a tri-layer resist, and may include an anti-reflection coating at the interface between the resist material and the capping layer 20. The block mask 22 may also include carbon, low temperature inorganic films, such as oxides and nitrides of silicon, and/or organic planarization layers including, e.g., spin on films, later baked and cross-linked for superior masking performance.

The capping layer 20 which remains exposed (unblocked by block mask 22) is bombarded with ions 15. The ion bombardment preferably includes inert chemistries with very low oxygen or other oxidizing agents. In a particularly useful embodiment, an inert or noble gas plasma, and more particularly, and unbiased He, Ar, Xe plasma is employed. In one embodiment, bombardment may include a down stream He/Ar/Xe microwave or inductively coupled plasma (ICP), surface wave plasmas and in general plasma with low plasma potential generated preferably without directed electric fields, i.e., no DC or capacitive fields. In another embodiment, a low energy cluster ion beam surface heating process may be employed using noble gas clusters. The per capita ion energies are preferably between about 0.1 eV and about 40 eV depending on the atomic mass of the ion with respect to the atomic mass of the capping layer 20.

In accordance with the bombardment, an intermixing occurs between the capping layer 20 and the underlying dielectric layer 18. Atoms of the capping layer 20 are pushed into the dielectric layer 18 to increase the sub-surface density of the capping layer materials. The intermixing process is preferably low temperature (e.g., less than about 400 degrees C.) and the block mask 22 selected is preferably not subject to degassing during the bombardment. An intermixed layer 24 is formed in the exposed areas of the capping layer 20. The intermixed layer 24 includes the capping layer material (sub-surface) and the material of the high dielectric constant layer 18.

Figure 3:
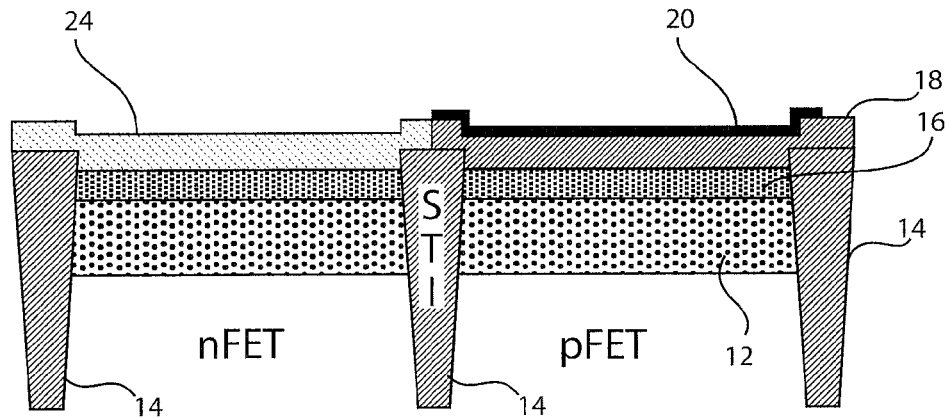
FIG. 3 is a cross-sectional view of the device of FIG. 2 having the block mask removed.

Referring to FIG. 3, the block mask 22 is removed using a solvent. The capping layer 20 remains intact on the dielectric layer 18 in an area designated for a particular device, e.g., a pFET device. Another area, e.g., for an nFET device, includes the intermixed layer 24.

Figure 4:
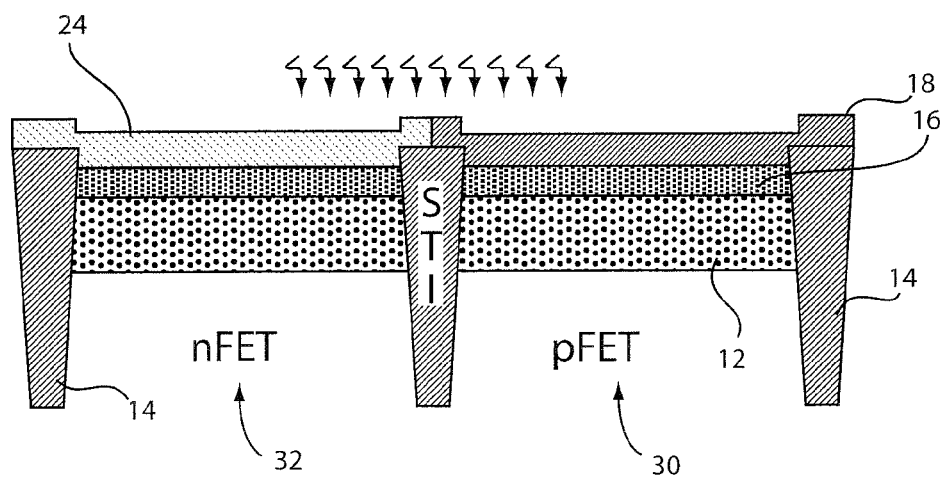
FIG. 4 is a cross-sectional view of the device of FIG. 3 having the first capping layer removed by a wet etch without removing the first intermixed layer.

Referring to FIG. 4, an etch process is performed to remove the intact capping layer 20 (unmixed portion). The etch process may include a wet etch, wherein the wet chemistry for the etch may include, e.g., any polar solvent that is capable of removing the soluble compound that forms. Examples of suitable polar solvents include $H_2O$, deionized $H_2O$, $H_2O_2$, water dilute with mineral acids such as DHF and other like polar solvents. Preferably, dilute water is used. The wet etching is performed at a temperature from about 0° to about 200°

C. The wet etching process is advantageously maskless meaning an etch mask is not needed to selectively remove the intact capping layer 20 (FIG. 3). By intermixing the capping layer 20 with the high dielectric layer 18, etch resistance is substantially increased to the wet etch. This is particularly useful since resist material (e.g., block mask material) is subject to degradation including loss of adhesion during wet etching. The wet etch results in the removal of the capping layer in portions 30. The intermixed capping layer 24 remains in portions 32.

Figure 5:
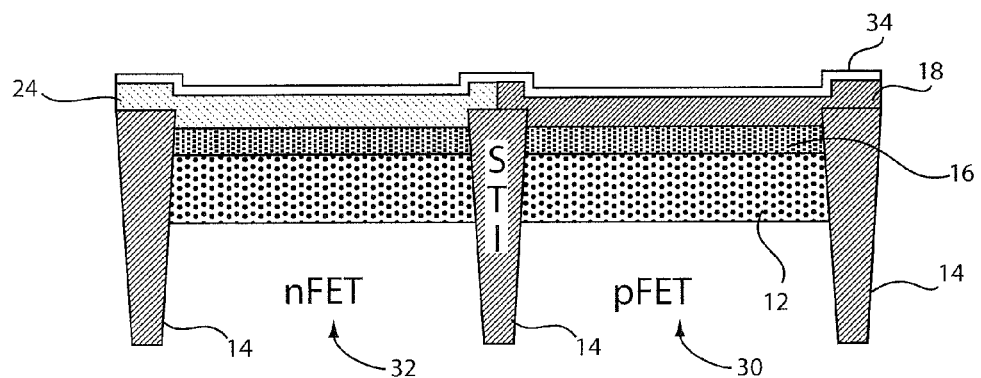
FIG. 5 is a cross-sectional view of the device of FIG. 4 having a second capping layer formed on the high dielectric constant layer and the first intermixed layer.

Referring to FIG. 5, a second capping layer 34 is formed. The second capping layer 34 is formed over the high dielectric constant layer 18 in regions 30 and over the intermixed capping layer 24 in regions 32. The second capping 34 layer may include, for example, lanthanum oxide (e.g., employed for nFET devices) or aluminum oxide (e.g., employed for pFET devices).

The high-k gate dielectric capping layer 34 for nFETs may comprise at least one element from Group 2 (e.g., IIA) or 3 (e.g., IIIA) of the Periodic Table of Elements. Examples of Group 2 elements that can be used include, for example, Be, Mg, Ca, Sr and/or Ba. Examples of Group 3 elements include, for example, Sc, Y, La, Ce, Pr, Nd, Pm, Sm, Eu, Ga, Tb, Dy, Ho, Er, Tm, Yb, Lu or mixtures thereof. Preferably, the high-k gate dielectric capping layer 34 is a rare earth metal-containing layer that comprises an oxide of La, Ce, Y, Sm, Er, and/or Tb, with $La_2O_3$ or LaN being most preferred. The high-k gate dielectric capping layer 34 for pFETs may comprise at least one element from Group 13, and may include B, Al, Ge, and/or In or their oxides.

If the first capping layer 24 included materials for an nFET, the second capping layer 34 would include materials for a pFET and vice versa. In addition, the capping layer materials and dimensions may be selected in accordance with a threshold voltage or other operating criteria for gate structures to be employed with transistor devices formed in later stages. The second capping layer 34 is preferably only a few nanometers thick, but may be varied depending on the application.

Figure 6:
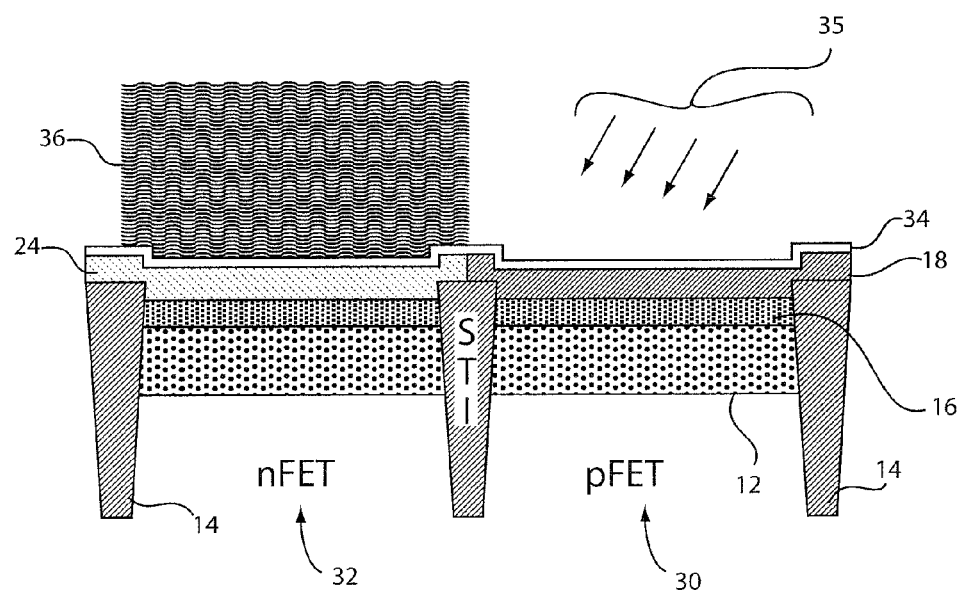
FIG. 6 is a cross-sectional view of the device of FIG. 5 having a block mask formed on portions of the second capping layer and other portions of the second capping layer being bombarded to form a second intermixed layer.

Referring to FIG. 6, a block mask 36 is deposited over the capping layer 34 and lithographically patterned to remain at locations where the capping layer 34 is to be removed. The block mask 36 preferably includes a mask that holds up well against noble gas ion bombardment. For example, block mask 36 should maintain its adhesion to capping layer 34 during subsequent processing. Block mask 36 may include a tri-layer resist, and may include an anti-reflection coating at the interface between the resist material and the capping layer 34. The block mask 36 may also include carbon, low temperature inorganic films, such as, oxides and nitrides of silicon and/or organic planarization layers including, e.g., spin on films, later baked, and cross-linked for superior masking performance.

The capping layer 34 which remains exposed (unblocked by block mask 36) is bombarded with ions 35. The ion bombardment preferably includes inert chemistries with very low oxygen or other oxidizing agents. In a particularly useful embodiment, an inert of noble gas plasma, and more particularly, and unbiased He, Ar, Xe plasma is employed. In one embodiment, a down stream He/Ar/Ex microwave, ICP or other techniques for plasma bombardment may be employed. In another embodiment, a low energy cluster ion beam surface heating process may be employed using noble gas clusters. The ion energies are preferably between about 0.1 eV and about 40 eV depending on the atomic mass of the ion with respect to the atomic mass of the capping layer 34.

In accordance with the bombardment, an intermixing occurs between the second capping layer 34 and the underlying dielectric layer 18 where exposed. Atoms of the second capping layer 34 are pushed into the dielectric layer 18 to increase the sub-surface density of the capping layer materials. The intermixing process is preferably low temperature (e.g., less than about 400 degrees C.) and the block mask 36 selected is preferably not subject to degassing during the bombardment.

Figure 7:
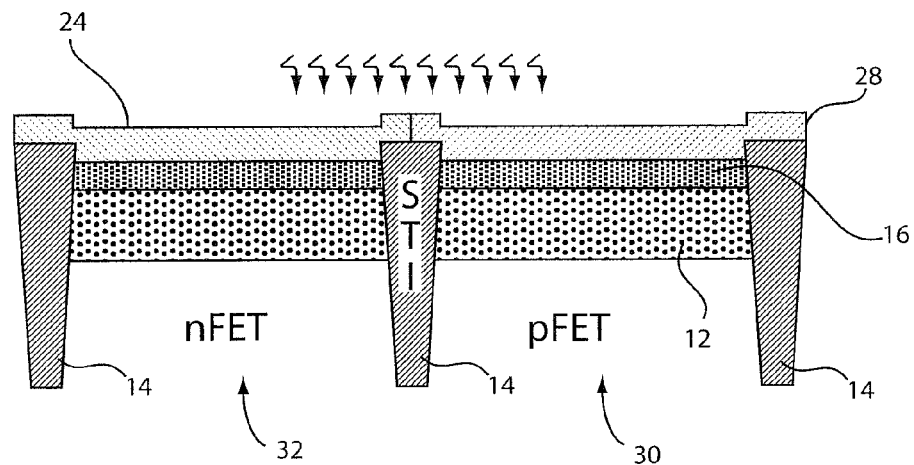
FIG. 7 is a cross-sectional view of the device of FIG. 6 having the second capping layer removed by a wet etch without removing the first and second intermixed layers.

Referring to FIG. 7, an intermixed layer 28 is formed in the exposed areas (portions 30) of the capping layer 34. The intermixed layer 28 includes the capping layer material (subsurface) and the material of the high dielectric constant layer 18 in regions 30. The block mask 36 is removed using a solvent. The second capping layer 34 remains intact on the intermixed layer 24 in area 32 designated for a particular device, e.g., an nFET device. Another area 30, e.g., for a pFET device, includes the intermixed layer 28. An etch process is performed to remove the intact second capping layer 34 (not shown) (unmixed portion). The etch process may include a wet etch, wherein the wet chemistry for the etch may include, e.g., any polar solvent that is capable of removing the soluble compound that forms. Examples of suitable polar solvents include $H_2O$, deionized $H_2O$, $H_2O_2$, water dilute with mineral acids such as DHF and other like polar solvents. Preferably, dilute water is used. The wet etching is performed at a temperature from about 0° to about 200° C. SC1 cleans may also be employed, i.e., mixtures of ammonium hydroxide and peroxide. The wet etching process is advantageously maskless meaning an etch mask is not needed to selectively remove the intact capping layer 34. By intermixing the capping layer 34 with the high dielectric layer 18 in regions 30, etch resistance is substantially increased to the wet etch. This is particularly useful since resist material (e.g., block mask material) is subject to degradation including loss of adhesion during wet etching and is thus avoided. The wet etch results in the removal of the capping layer in portions 32. The intermixed capping layer 28 remains in portions 30.

Figure 8:
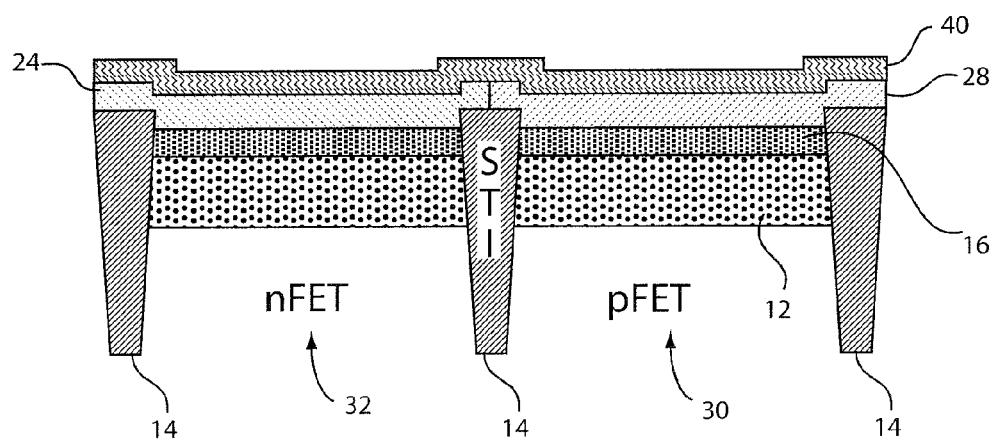
FIG. 8 is a cross-sectional view of the device of FIG. 7 having a gate conductor formed on the first and second intermixed layers.

Referring to FIG. 8, after the wet etch, a structure results where the high dielectric constant dielectric layer 18 includes two separate intermixed layers 24 and 28. It should be understood that the intermixed layer 24 may include material consistent with the formation of an nFET device (e.g., lanthanum oxide) while intermixed layer 28 includes materials consistent with a pFET device (e.g., aluminum oxide). The intermixed layers 24 and 28 may also be provided to tune threshold voltages for different doped devices (e.g., nFET and pFETs, different threshold voltages for nFETs, or different threshold voltages for pFETs). A gate conductor 40 is deposited.

While the illustrative example presented here describes alternately forming nFETs and pFETs, other processed regions are also contemplated. For example, in addition, the masking and intermixing steps may be employed to create nFETs and/or pFETs with different threshold voltages based on the adjustment of intermixing parameters (e.g., ion energies, duration, etc.), material choices, etc.

Figure 9:
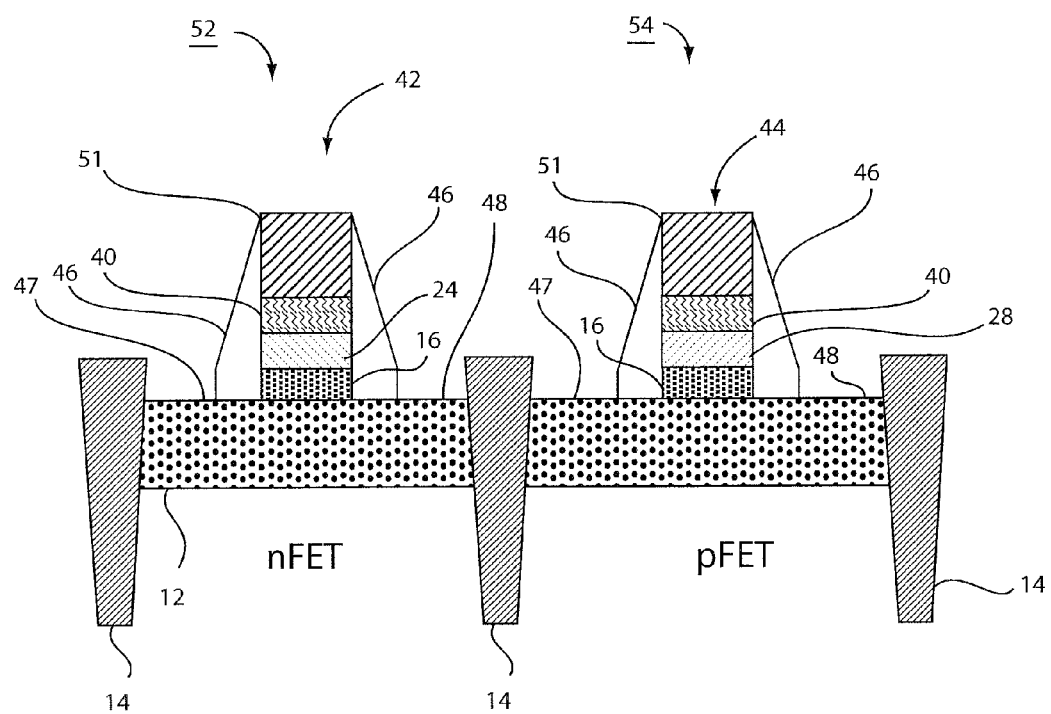
FIG. 9 is a cross-sectional view showing a single metal, single dielectric CMOS device formed from the first and second intermixed layers.

Referring to FIG. 9, a CMOS device 50 is formed in accordance with the present principles. The CMOS device 50 includes an nFET 52 and a pFET 54. The gate conductor 40 is deposited followed by a gate dielectric layer 51. The gate conductor 40 is preferably a single conductive material (a single metal). Lithographic patterning and etching form gate stacks 42 and 44. The gate stacks 42 and 44 include spacers 46 formed on sidewalls. By employing the present principles, the intermixed layers 24 and 28 permit the simultaneous patterning of gate stacks 42 and 44. A single metal/single dielectric gate structure (each of intermixed layers 24 and 28) is thereby achieved which is suitable for use in a number of different transistors structures (nFETS, pFETs, etc.).

Doping of active areas 47 and 48 adjacent to gate stacks 42 and 44 is performed after the gate structures have been fabricated. The doping process may include applying masks to permit selective doping processes as is known in the art. For example, a polarity specific doping is achieved for different device polarities and/or different threshold voltage devices of a same polarity.

Figure 10:
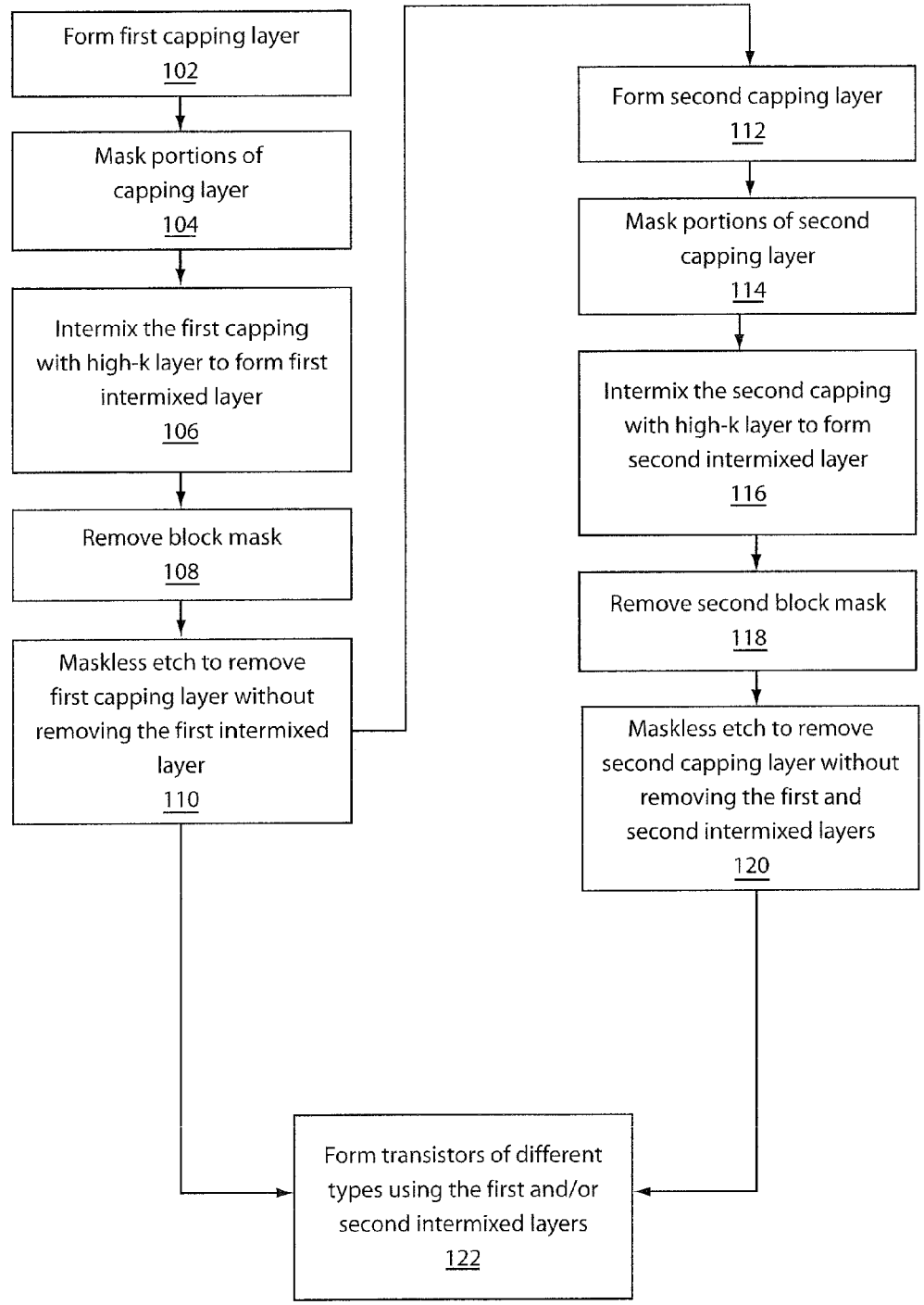
FIG. 10 is a flow diagram showing a method for forming a single metal, single dielectric CMOS device.

Referring to FIG. 10, a method for forming a complementary metal oxide semiconductor (CMOS) device is illustratively depicted. In block 102, a first capping layer is formed on a dielectric layer. The dielectric layer preferably includes a high dielectric constant layer. In block 104, portions of the capping layer are blocked off using a block mask in regions where the capping layer is to be preserved. The first capping layer may include at least one of lanthanum oxide and aluminum oxide.

In block 106, exposed portions of the first capping layer are intermixed preferably by ion bombardment to drive elements of the first capping layer into the dielectric layer to from a first intermixed layer. The bombarding of exposed portions of the first (or second) capping layer includes performing an inert bombardment by noble gas ions from a plasma discharge.

In block 108, the block mask is removed. In block 110, the first capping layer and the first intermixed layer are exposed to an etching process such that the first capping layer is removed to re-expose the dielectric layer in regions without removing the first intermixed layer. The etching is preferably performed using a maskless wet etching wherein the first (or second) capping layer is selectively removed while the first (or second) intermixed layer remains intact.

Further processing may include the following. In block 112, a second capping layer is formed on the re-exposed dielectric layer and the first intermixed layer. The second capping layer may include the other of lanthanum oxide and aluminum oxide. In block 114, portions of the second capping layer are blocked using a second block mask in regions where the second capping layer is to be preserved. In block 116, exposed portions of the second capping layer are intermixed, preferably by bombardment, to drive elements of the second capping layer into the dielectric layer to form a second intermixed layer. In block 118, the second block mask is removed. In block 120, the second capping layer and the second intermixed layer are etched such that the second capping layer is removed to re-expose the first intermixed layer in regions without removing the second intermixed layer. In block 122, transistors are formed using the first intermixed layer for a first transistor type and using the second intermixed layer for a second transistor type. Forming transistors may include forming n-type field effect transistors (FETs) using the first intermixed layer and p-type FETs using the second intermixed layer, or forming FETs having different threshold voltages using at least one of the first intermixed layer and the second intermixed layer. Forming transistors may also include forming gate structures for a complementary metal oxide semiconductor (CMOS) device including the first intermixed layer for an nFET device and the second intermixed layer in a pFET device.

Having described preferred embodiments of a single metal gate CMOS by intermixing polarity specific capping layers (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a complementary metal oxide semiconductor device, comprising:
   forming a first capping layer on a dielectric layer;
   blocking portions of the capping layer in regions where the capping layer is to be preserved using a block mask;
   at exposed portions of the first capping layer, performing an inert bombardment of noble gas ions from a plasma discharge to intermix elements of the first capping layer into the dielectric layer to form a first intermixed layer;
   removing the block mask; and
   etching the first capping layer such that the first capping layer is removed to re-expose the dielectric layer in regions without removing the first intermixed layer.

2. The method as recited in claim 1, wherein forming a first capping layer includes forming at least one of lanthanum oxide and aluminum oxide.

3. The method as recited in claim 1, wherein etching the first capping layer and the first intermixed layer includes performing a maskless wet etching wherein the first capping layer is selectively removed while the first intermixed layer remains intact.

4. The method as recited in claim 1, further comprising:
   forming a second capping layer on the re-exposed dielectric layer and the first intermixed layer;
   blocking portions in the second capping layer in regions where the second capping layer is to be preserved using a second block mask;
   intermixing elements of the second capping layer into the dielectric layer to form a second intermixed layer;
   removing the second block mask; and
   etching the second capping layer such that the second capping layer is removed to re-expose the first intermixed layer in regions without removing the second intermixed layer.

5. The method as recited in claim 4, wherein the first capping layer includes a material compatible with a first type field effect transistor (FET) structure and the second capping layer includes a material compatible with a second type FET structure.

6. The method as recited in claim 1, further comprising:
   forming transistors using the first intermixed layer for a first transistor type and using the second intermixed layer for a second transistor type such that a single metal, single dielectric type device is fabricated.

7. The method as recited in claim 6, wherein forming transistors includes forming n-type field effect transistors (FETs) using the first intermixed layer and p-type FETs using the second intermixed layer.

8. The method as recited in claim 6, wherein forming transistors includes forming FETs having different threshold voltages using at least the first intermixed layer and the second intermixed layer.

9. A method for forming a complementary metal oxide semiconductor device, comprising:
   forming a first capping layer on a dielectric layer;
   blocking portions in the capping layer in regions where the capping layer is to be preserved using a block mask;
   bombarding exposed portions of the first capping layer with noble gas ions from a plasma discharge to drive elements of the first capping layer into the dielectric layer to form a first intermixed layer;
   removing the block mask;

etching the first capping layer such that the first capping layer is removed to re-expose the dielectric layer in regions without removing the first intermixed layer;

forming a second capping layer on the re-exposed dielectric layer and the first intermixed layer;

blocking portions in the second capping layer in regions where the second capping layer is to be preserved using a second block mask;

bombarding exposed portions of the second capping layer with noble gas ions from a plasma discharge to drive elements of the second capping layer into the dielectric layer to form a second intermixed layer;

removing the second block mask;

etching the second capping layer and the second intermixed layer such that the second capping layer is removed to re-expose the first intermixed layer in regions without removing the second intermixed layer; and forming transistors using the first intermixed layer for a first transistor type and using the second intermixed layer for a second transistor type.

10. The method as recited in claim 9, wherein forming a first capping layer includes forming at least one of lanthanum oxide and aluminum oxide.

11. The method as recited in claim 9, wherein etching the first capping layer and the first intermixed layer includes performing a maskless wet etching wherein the first capping layer is selectively removed while the first intermixed layer remains intact.

12. The method as recited in claim 9, wherein forming transistors includes forming n-type field effect transistors (FETs) using the first intermixed layer and p-type FETs using the second intermixed layer.

13. The method as recited in claim 9, wherein forming transistors includes forming FETs having different threshold voltages using at least the first intermixed layer and the second intermixed layer.

14. The method as recited in claim 9, wherein forming transistors includes forming gate structures for a complementary metal oxide semiconductor (CMOS) device including the first intermixed layer for an nFET device and the second intermixed layer in a pFET device.

* * * * *